(12) United States Patent
Shukla et al.

(10) Patent No.: US 12,322,451 B2
(45) Date of Patent: Jun. 3, 2025

(54) MEMORY SYSTEMS WITH FLEXIBLE ERASE SUSPEND-RESUME OPERATIONS, AND ASSOCIATED SYSTEMS, DEVICES, AND METHODS

(71) Applicant: Micron Technology, Inc., Boise, ID (US)

(72) Inventors: Pitamber Shukla, Boise, ID (US); Jiun-Horng Lai, Kanagawa (JP); Ching-Huang Lu, Fremont, CA (US); Fulvio Rori, Boise, ID (US); Wai Ying Lo, Boise, ID (US); Scott A. Stoller, Boise, ID (US)

(73) Assignee: Micron Technology, Inc., Boise, ID (US)

(*) Notice: Subject to any disclaimer, the term of this patent is extended or adjusted under 35 U.S.C. 154(b) by 359 days.

(21) Appl. No.: 17/739,789

(22) Filed: May 9, 2022

(65) Prior Publication Data
US 2023/0360708 A1    Nov. 9, 2023

(51) Int. Cl.
*G11C 16/16* (2006.01)
*G11C 16/34* (2006.01)

(52) U.S. Cl.
CPC .......... *G11C 16/16* (2013.01); *G11C 16/3445* (2013.01)

(58) Field of Classification Search
CPC ..... G11C 16/16; G11C 16/3445; G11C 16/32; G11C 16/14; G11C 16/225
See application file for complete search history.

(56) References Cited

U.S. PATENT DOCUMENTS

2022/0336029 A1* 10/2022 Zhao .................. G11C 16/3477

* cited by examiner

Primary Examiner — Xiaochun L Chen
(74) Attorney, Agent, or Firm — Perkins Coie LLP (57) ABSTRACT

Memory systems with flexible erase suspend-resume operations are described herein. In one embodiment, a memory device is configured to receive an erase suspend command while a first erase pulse of an erase operation is at a flattop voltage. In response, the memory device suspends the erase operation. The memory device further resumes the erase operation such that a second erase pulse of the erase operation is ramped to the flattop voltage. Absent intervening erase suspend operations, erase operations of the memory device can include a single erase pulse that remains at the flattop voltage for a total duration. A first total duration plus a second total duration the first and second erase pulses, respectively, remain at the flattop voltage remains less than or equal to the total duration the single erase pulse remains at the flattop voltage.

22 Claims, 5 Drawing Sheets

MEMORY SYSTEMS WITH FLEXIBLE ERASE SUSPEND-RESUME OPERATIONS, AND ASSOCIATED SYSTEMS, DEVICES, AND METHODS

TECHNICAL FIELD

The present disclosure is related to memory systems, devices, and associated methods. For example, several embodiments of the present technology are directed to memory systems with flexible erase suspend-resume operations.

BACKGROUND

Memory devices are widely used to store information related to various electronic devices such as computers, wireless communication devices, cameras, digital displays, and the like. Memory devices are frequently provided as internal, integrated circuits and/or as part of external removable devices in computers or other electronic devices. There are many different types of memory, including volatile and non-volatile memory. Volatile memory, including static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, may include increasing memory cell density, increasing performance (e.g., read, write, erase speeds) or otherwise reducing operational latency, increasing reliability, increasing data retention, reducing power consumption, reducing manufacturing costs, or reducing dimensional attributes, among other metrics.

BRIEF DESCRIPTION OF THE DRAWINGS

The disclosure will be understood more fully from the detailed description given below and from the accompanying drawings of various embodiments of the disclosure. The components in the drawings are not necessarily to scale. Instead, emphasis is placed on illustrating clearly the principles of the present technology. The drawings should not be taken to limit the disclosure to the specific embodiments, but are provided for explanation and understanding.

DETAILED DESCRIPTION

As discussed in greater detail below, the technology disclosed herein relates to memory systems and devices (and associated methods) having flexible erase suspend-resume operations that dynamically split a full erase pulse flattop of an erase operation into multiple segmentations corresponding to separate erase pulses (a) upon detection of an erase suspend command while an erase pulse of the erase operation is at flattop and (b) while avoiding over erasure of corresponding memory cells. A person skilled in the art, however, will understand that the technology may have additional embodiments and that the technology may be practiced without several of the details of the embodiments described below with reference to FIGS. 1-5.

In the illustrated embodiments below, the memory systems and devices are primarily described in the context of memory devices incorporating NAND-based storage media (e.g., NAND flash, 3D-NAND flash). Memory systems and devices configured in accordance with other embodiments of the present technology, however, can include other types of memory devices (e.g., phase change memory, ferroelectric, etc.) and/or can include main memories that are not NAND-based (e.g., NOR-based) or only partially NAND-based. Moreover, memory systems and devices configured in accordance with still other embodiments of the present technology can include volatile memories, such as DRAM and/or SRAM memories.

A. OVERVIEW

In many memory devices, such as memory devices employing NAND-based or NOR-based storage media, memory cells are arranged in memory blocks that represent the smallest unit for erase operations. For example, NAND-flash memory cells are arranged in memory pages, and the memory pages are arranged in memory blocks. Continuing with this example, the NAND-flash memory cells are commonly programmed or read on a memory-page basis, and the memory cells are erased on a memory-block basis. For this reason, erase operations are often considerably longer in duration than read or write operations. Thus, to prioritize read or write operations in read-intensive or write-intensive applications, many memory devices can suspend (e.g., pause, interrupt) erase operations to perform read or write operations and thereby decrease operational latency of the read or write operations (e.g., for quality of service (QoS) purposes).

Figure 1A:
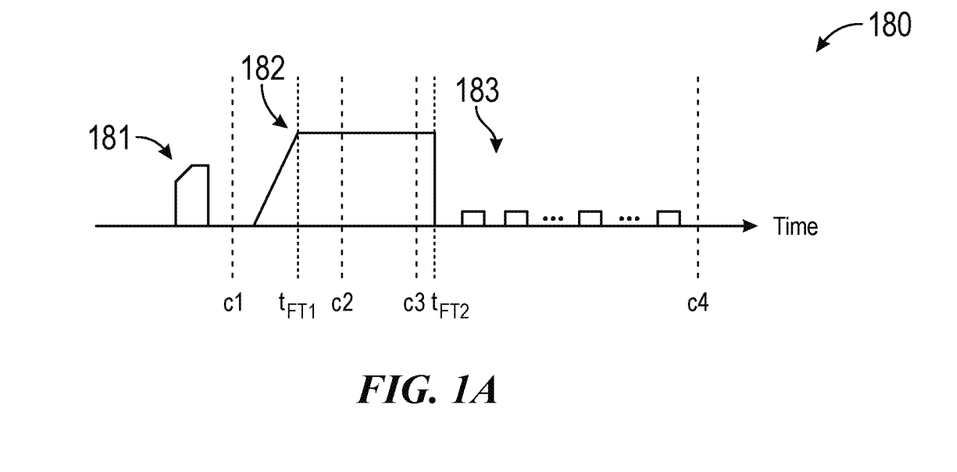
FIG. 1A is a line plot of signal pulses that can be issued during an erase operation of many memory devices.

More specifically, many memory devices can include checkpoints positioned at various points along an erase operation at which the memory devices can suspend the erase operation to perform an intervening read or write operation. For example, FIG. 1A is a line plot 180 of various signal pulses 181-183 that can be issued during an erase operation of many memory devices. More specifically, the line plot 180 includes a pre-program (PPGM) pulse 181, an erase pulse 182, and a series of erase verify (EV) pulses 183. As shown, the erase operation includes four checkpoints: (a) a first checkpoint c1 that is positioned after the PPGM pulse 181 and before the erase pulse 182, (b) a second checkpoint c2 that is positioned at a first point along a flattop (e.g., the plateaued portion between $t_{FT1}$ and $t_{FT2}$ in FIG. 1A) of the erase pulse 182, (c) a third checkpoint c3 that is positioned at a second point along the flattop of the erase pulse 182, and (d) a fourth checkpoint c4 that is positioned after the EV pulses 183. When a memory device receives a prioritized command while executing the erase operation, the memory device can proceed to the next nearest one of the checkpoints c1-c4 shown in FIG. 1A, suspend the erase operation, execute the prioritized command, and then later return to executing the erase operation. In many memory devices, the checkpoints c1-c4 are commonly positioned such that a time elapsed between when a memory device receives an erase suspend command and when the memory device returns to a ready state at which the memory device can execute a prioritized command does not exceed a maximum specified time (e.g., 150 μs), known as erase suspend operation time $t_{ESPD}$.

As the memory device resumes the erase operation after completing the prioritized command, the memory device typically resumes the erase operation at the beginning of the series of EV pulses 183 to check whether memory cells were erased before the erase operation was suspended. Thus, unless the memory device suspended the erase operation at the fourth checkpoint c4 shown in FIG. 1A, the erase verification procedure that is performed when the memory device resumes the erase operation will likely fail, meaning that the memory device will issue and execute another full erase pulse 182 before the memory device completes the erase operation.

For the sake of clarity and understanding, consider FIG. 1B that is a line plot 185 illustrating signal pulses that can be issued during an erase operation that is (a) suspended to execute a read operation and (b) later resumed. As shown, a memory device issues a PPGM pulse 181 and then issues a first erase pulse 182a. During the flattop period of the first erase pulse 182a, the memory device receives a prioritized command at time t1. In response, the memory device proceeds to the next nearest checkpoint (the second checkpoint c2), suspends the erase operation, returns the memory device to a ready state by time t2, executes the prioritized command, and then resumes the erase operation at time t3 at the beginning of a first series of EV pulses 183a. In many memory devices, after the erase operation is resumed, a memory device can prevent the erase operation from being suspended again until a minimum amount of time (known as erase resume to erase suspend delay $t_{RSESPD}$) has elapsed (e.g., to allow time to perform the erase verification procedure).

Figure 1B:
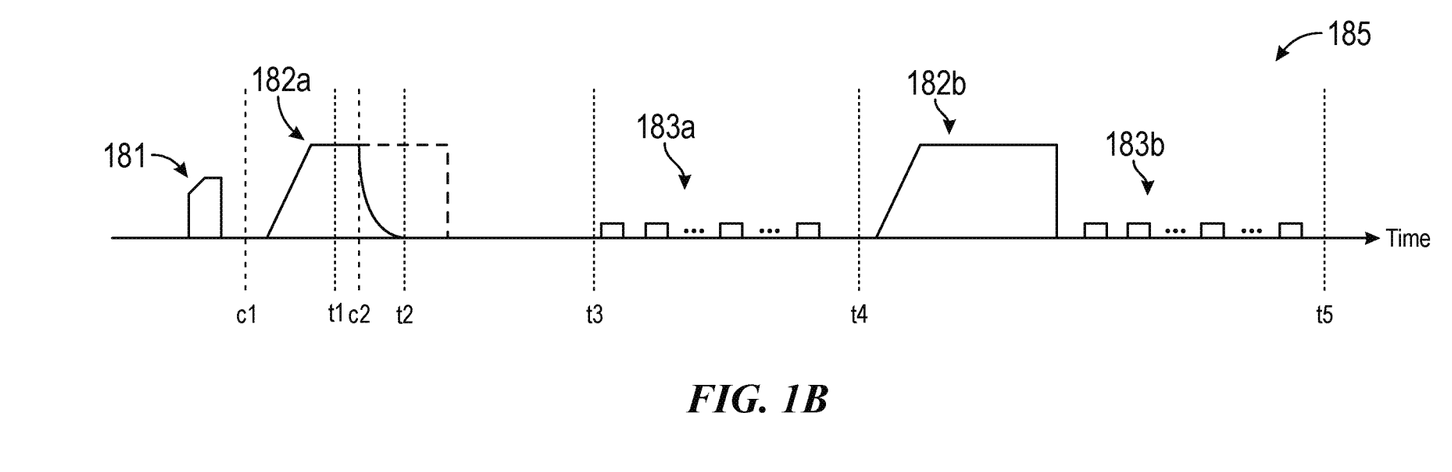
FIG. 1B is a line plot of signal pulses that can be issued in many memory devices during an erase operation that is (a) suspended to execute a read or write operation and (b) later resumed.

As shown in FIG. 1B, because the memory device did not execute a full erase pulse before suspending the erase operation at the second checkpoint c2, the erase verification procedure performed between time t3 and time t4 of FIG. 1B is likely to fail at time t4. In response, the memory device (a) issues another full erase pulse 182b. Absent any other intervening prioritized commands, the memory device can complete the erase pulse 182b and then perform another erase verification procedure corresponding to a second series of EV pulses 183b that is likely to pass at time t5. On the other hand, if the memory device receives another prioritized command during the flattop portion of the erase pulse 182b, the memory device can suspend the erase operation again and repeat a cycle similar to the procedure illustrated between time t1 and t5 in FIG. 1B. Depending on the number and frequency of intervening prioritized commands for which the memory device suspends the erase operation, the process illustrated between t1 and t5 of FIG. 1B can be repeated without forward progress, at least until the memory device has an opportunity to complete a full erase pulse without interruption and/or until one of the erase verification procedures passes.

Therefore, assuming that the pulse 182 of FIG. 1A and the pulse 182b of FIG. 1B both correspond to a full erase pulse without interruption, FIG. 1B illustrates an over-erase situation in which the memory cells of the memory device are erased for longer than required (e.g., because the summation of the flattop portion of the erase pulse 182a and the flattop portion of the erase pulse 182b is greater than the flattop portion of a single, full erase pulse). The over-erase situation illustrated in FIG. 1B can be exacerbated as the erase operation of FIG. 1B is suspended a greater number of times (e.g., more than once) than shown in FIG. 1B. And because erase operations can negatively affect memory cell reliability, the erase suspend-resume procedure outlined above can invoke memory cell reliability problems and a decrease in QoS.

To address these concerns, the present technology is generally directed to memory systems and devices having flexible erase suspend-resume operations that dynamically split a full erase pulse flattop of an erase operation into multiple segmentations corresponding to separate erase pulses (a) upon detection of an erase suspend command while an erase pulse of the erase operation is at flattop and (b) while avoiding over erasure of corresponding memory cells. More specifically, as an initial erase pulse of an erase operation reaches flattop, memory devices of the present technology can initiate a timer and run the timer for as long as the erase pulse remains at flattop. When the memory device receives an erase suspend command (e.g., to execute another prioritized operation, such as a read or write operation), the memory device can pause the timer, store the current timer value, discharge the erase pulse, execute the prioritized operation, and then resume the erase operation. To resume the erase operation, the memory device can ramp a second erase pulse to flattop (e.g., without first performing an erase verification procedure), set the timer to the stored timer value, and then run the timer.

Absent intervening erase suspend commands while an erase pulse of the erase operation is at flattop, the timer can run until it becomes exhausted. For example, the timer can be decremented while an erase pulse of the erase operation is at flattop. Continuing with this example, the timer can be initiated to a default (or target) value (e.g., representing a maximum, cumulative amount of time erase pulses of the erase operation are to remain at flattop). The timer can be decremented starting from the default value and become exhausted when the timer reaches zero. As another example, the timer can be incremented while an erase pulse of the erase operation is at flattop. Continuing with this other example, the timer can be initiated to zero, and the timer can become exhausted when the timer reaches the default value.

When the timer becomes exhausted, the erase pulse can be discharged, and the memory device can proceed to perform an erase verification procedure and/or to complete the erase operation. As such, memory devices of the present technology are expected to avoid over erasure of memory cells because at no point during an erase operation should the sum of the flattop widths of all erase pulses of the erase operation exceed the flattop width of a single erase pulse that would occur in the event that the erase operation is never suspended while the erase pulse is at flattop. Therefore, memory devices of the present technology are expected to avoid the degradation of memory cell reliability caused by over erasure that is possible in erase suspend-resume operations of other memory devices.

Furthermore, because memory devices of the present technology can immediately suspend an erase operation upon detection of an erase suspend command (e.g., rather than, without, and/or instead of waiting for a next checkpoint), memory devices of the present technology are expected to reduce (a) erase suspend operation time $t_{ESPD}$ in comparison to other memory devices and/or (b) an erase resume to erase suspend delay $t_{RSESPD}$ in comparison to other memory devices. Moreover, because memory devices of the present technology can resume an erase operation by ramping another erase pulse (e.g., rather than first performing an erase verification procedure), memory devices of the present technology are further expected to reduce the erase resume to erase suspend delay $t_{RSESPD}$ in comparison to other memory devices.

B. SELECTED EMBODIMENTS OF MEMORY SYSTEMS AND DEVICES WITH FLEXIBLE ERASE SUSPEND-RESUME OPERATIONS, AND ASSOCIATED METHODS

Figure 2:
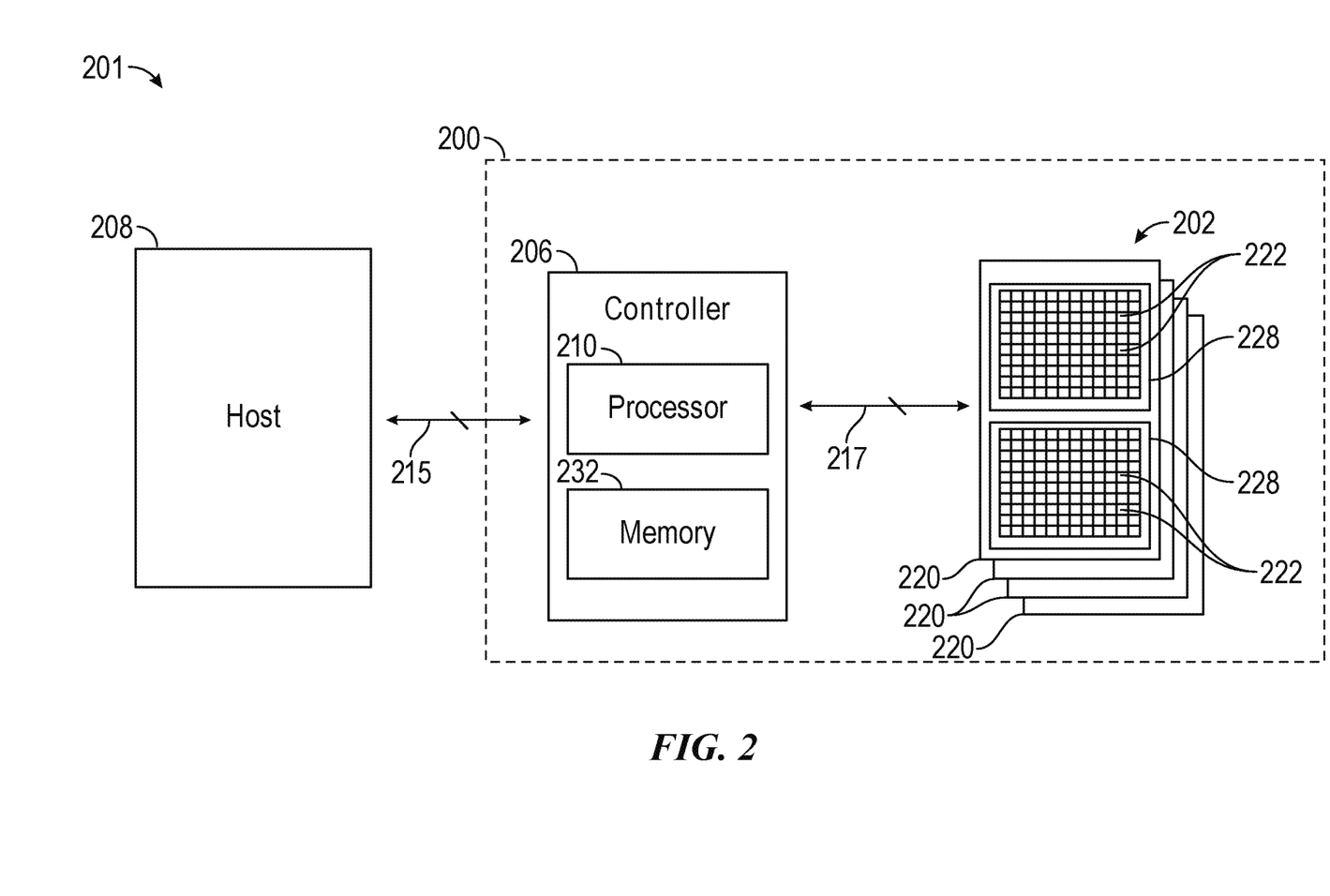
FIG. 2 is a partially schematic block diagram of a memory system configured in accordance with various embodiments of the present technology.

FIG. 2 is a block diagram of a memory system 201 having a memory device 200 configured in accordance with various embodiments of the present technology. An example of a memory device 200 is a storage system, such as a solid-state drive (SSD). In some embodiments, the memory device 200 is a hybrid memory/storage sub-system.

As shown, the memory device 200 includes a memory array 202 and a controller 206 (e.g., a processing device, an internal processing circuit) operably coupling the memory array 202 to a host device 208 (e.g., an upstream central processor (CPU)). The memory array 202 can include a plurality of memory regions, or memory units 220, which include a plurality of memory cells 222. Memory units 220 can be individual memory dies, memory planes in a single memory die, a stack of memory dies vertically connected with through-silicon vias (TSVs), or the like. In one embodiment, each of the memory units 220 can be formed from a semiconductor die and arranged with other memory unit dies in a single device package (not shown). In other embodiments, one or more of the memory units 220 can be co-located on a single die and/or distributed across multiple device packages.

The memory cells 222 can include, for example, NAND flash and/or other suitable storage elements (e.g., NOR flash, read only memory (ROM), electrically erasable programmable ROM EEPROM, erasable programmable ROM (EPROM), ferroelectric, magnetoresistive, phase change memory, etc.) configured to store data persistently or semi-persistently. In one example, the memory cells 222 are arranged in memory pages that are arranged in memory blocks 228. Continuing with this example, the memory blocks 228 can be arranged in memory planes, and the memory planes can be arranged in memory dies. As a specific example, the memory cells 222 can include NAND-flash storage elements arranged in a three-dimensional (3D) NAND configuration or architecture.

The memory array 202 and/or the individual memory units 220 can also include other circuit components (not shown) (e.g., memory subsystems), such as internal processing circuits, multiplexers, decoders, buffers, read/write drivers, address registers, data out/data in registers, etc., for accessing and/or programming (e.g., writing or erasing) the memory cells 222 and other functionality, such as for processing information and/or communicating with the controller 206 via a device bus 217.

The controller 206 can be a microcontroller, special purpose logic circuitry (e.g., a field programmable gate array (FPGA), an application specific integrated circuit (ASIC), etc.), or other suitable processor. The controller 206 can include a processor 210 configured to execute instructions stored in memory 232. The processor 210 can be a processing device.

The memory 232 is configured to store various processes, logic flows, routines, and/or firmware for controlling operation of the memory device 200, including managing the memory array 202 and handling communications between the memory device 200 and the host device 208. For example, the memory 232 can store firmware for performing flexible erase suspend-resume operations described in greater detail below with reference to FIGS. 3-4B. In some embodiments, the memory 232 can include timers and/or memory registers (e.g., for storing memory pointers, fetched data, timer values, etc.). The memory 232 can also include read-only memory (ROM) for storing micro-code. In the illustrated embodiment, the memory 232 is embedded into the controller 206. In other embodiments, all or a subset of the memory 232 can be positioned at other locations within the memory device 200. For example, the memory 232 can include a restricted region of the memory array 202 and/or can be positioned separate or apart from the memory array 202 and the controller 206.

The controller 206 communicates with the host device 208 over a system bus 215. In some embodiments, the host device 208 and the controller 206 can communicate over a serial interface, such as a serial attached SCSI (SAS), a serial AT attachment (SATA) interface, a peripheral component interconnect express (PCIe), or other suitable interface (e.g., a parallel interface). The host device 208 can send various requests (in the form of, e.g., a packet or stream of packets) to the controller 206. A request can include a command to write, erase, return information, and/or perform a particular operation (e.g., a TRIM operation). In some embodiments, the host device 208 can send various vendor specific (VS) commands to perform one or more restricted operations (e.g., access a restricted region of the memory array 202, enter a debugging mode, reset restricted data, etc.). In operation, the controller 206 can directly read, write, erase, or otherwise program or manage the various memory regions of the memory array 202, such as by reading from and/or writing to groups of memory cells 222 (e.g., memory pages, stripes of memory pages, memory blocks 228, etc.).

Figure 3:
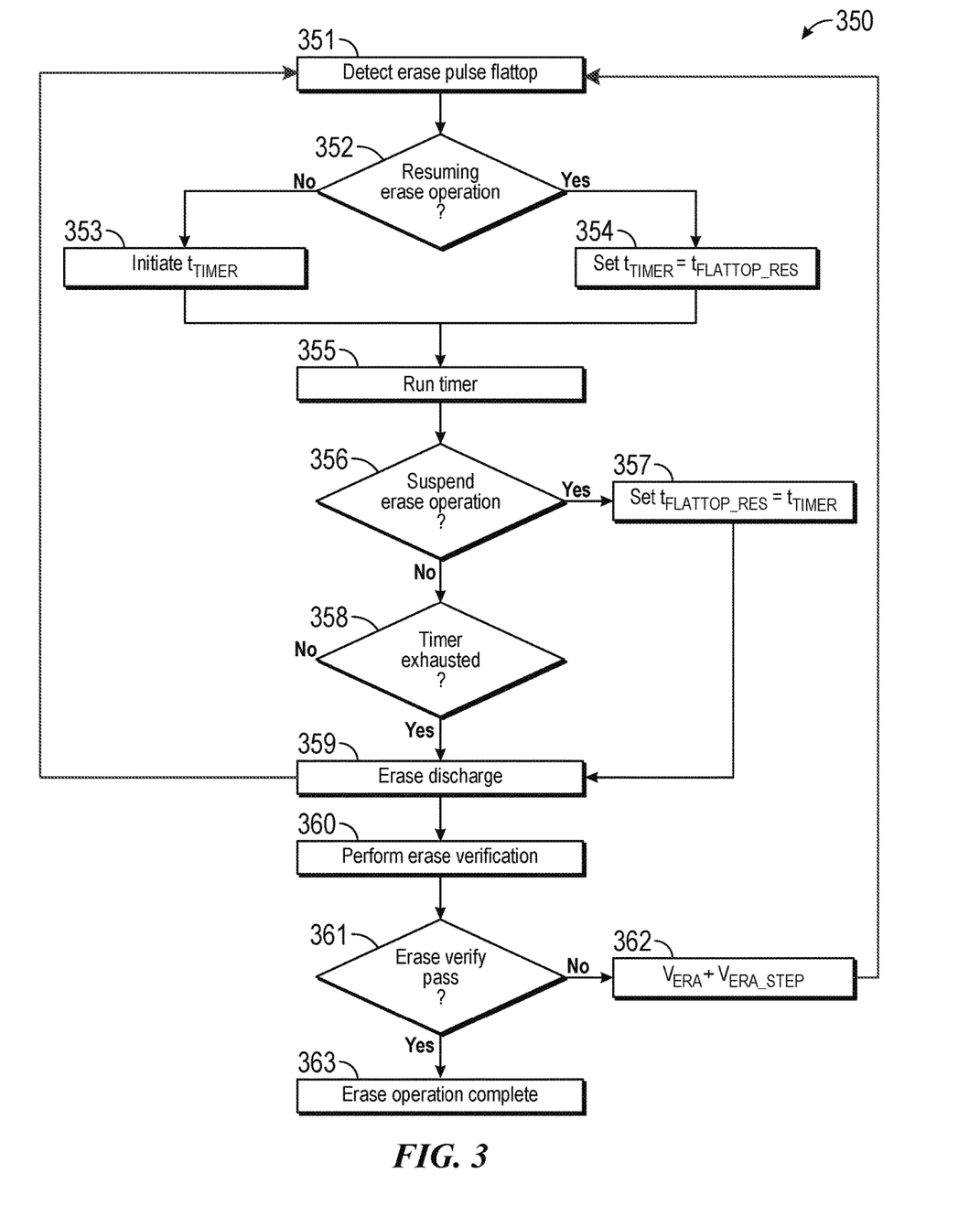
FIG. 3 is a flow diagram illustrating an erase suspend-resume routine configured in accordance with various embodiments of the present technology.

FIG. 3 is a flow diagram illustrating an erase suspend-resume routine 350 configured in accordance with various embodiments of the present technology. The routine 350 is illustrated as a set of steps or blocks 351-363. All or a subset of one or more of the blocks 351-363 can be executed by various components of a memory system (e.g., the memory system 201 of FIG. 2), such as (a) by a controller and/or a memory array of a memory device and/or (b) by a host device. Furthermore, all or a subset of one or more of the blocks 351-363 can be executed in accordance with the discussion above. For the sake of clarity and understanding, several of the block 351-363 of the routine 350 are discussed below with reference to FIG. 4A that illustrates a line plot 480a of signal pulses that can be issued during an erase operation that is (a) suspended to execute another prioritized operation and (b) later resumed, in accordance with various embodiments of the present technology.

At block 351, the routine 350 begins by detecting that an erase pulse of an erase operation is at flattop. As discussed above, the flattop of an erase pulse refers to the plateaued portion of the erase pulse after the erase pulse is ramped to an erase voltage $V_{ERA}$. Stated another way, an erase pulse is often held at the erase voltage $V_{ERA}$ for a specified amount of time to erase or reset memory cells to a first data state (e.g., a '1' data state). The amount of time or duration the erase pulse is held at the erase voltage $V_{ERA}$ corresponds to the flattop portion of the erase pulse. For example, referring to FIG. 4A, the flattop portion of the erase pulse 482a is illustrated between time t1 and time t2, and the flattop portion of the erase pulse 482b is illustrated between time t4 and time t5. In some embodiments, the routine 350 can detect that an erase pulse is at flattop by monitoring the erase voltage $V_{ERA}$ and/or comparing the erase voltage $V_{ERA}$ to a threshold voltage value. In these and other embodiments, the routine 350 can determine that an erase pulse is at flattop a set amount of time after initially beginning to ramp the erase pulse and/or after detecting the occurrence of another event.

At block 352, the routine 350 continues by determining whether the erase operation is being resumed after previously being suspended. For example, referring to FIG. 4A, the routine 350 detects flattop of the erase pulse 482a at time t1 and determines that the corresponding erase operation is not being resumed (block 352: No), meaning that the erase pulse 482a represents a first erase pulse of the corresponding erase operation. On the other hand, at time t4, the routine 350 detects flattop of the erase pulse 482b and determines that the corresponding erase operation is being resumed (block 352: Yes). In other words, at time t4, the routine 350 determines that the corresponding erase operation was previously suspended during flattop of a previous erase pulse (e.g., the erase pulse 482a) and is now being resumed.

In some embodiments, the routine 350 determines whether the erase pulse is being resumed by analyzing one or more values stored on the memory device. For example, the routine 350 can store a timer value $t_{TIMER}$ representing an amount of time erase pulses of an erase operation remain at flattop before proceeding to erase verification. Continuing with this example, the routine 350 can store a maximum flattop value $t_{FLATTOP}$ representing a maximum, cumulative amount of time erase pulses of an erase operation are to remain at flattop before proceeding to erase verification. In other words, referring to FIG. 4A, the maximum flattop value $t_{FLATTOP}$ (shown in FIG. 4A as the difference between time t3 and time t1) can be predetermined or preset, and the amount of time FT1 the erase pulse 482a remains at flattop plus the amount of time FT2 the erase pulse 482b remains at flattop (plus the amount of time any other erase pulses of the erase operation remain at flattop) must be less than or equal to the maximum flattop value $t_{FLATTOP}$. Additionally, the routine 350 can store a flattop resumption value $t_{FLATTOP\_RES}$ representing, for example, a value of the timer value $t_{TIMER}$ when the erase operation is suspended. In other words, the flattop resumption value $t_{FLATTOP\_RES}$ can represent the maximum flattop value $t_{FLATTOP}$ less an amount of time that (e.g., previous) erase pulses of an erase operation have spent at flattop.

In embodiments in which the timer value $t_{TIMER}$ is decremented while an erase pulse of an erase operation remains at flattop (as described in greater detail below with reference to blocks 355-358), the routine 350 can determine the erase operation is not being resumed (block 352: No) when the timer value $t_{TIMER}$ and/or the flattop resumption value $t_{FLATTOP}$ RES are exhausted (e.g., are zero), are set to a NULL value (e.g., indicating that the timer value $t_{TIMER}$ and/or the flattop resumption value $t_{FLATTOP\_RES}$ have not yet been set or initiated), or are set to the maximum flattop value $t_{FLATTOP}$ (e.g., indicating that erase pulses of the erase operation have not spent any time at flattop). On the other hand, the routine 350 can determine that the erase operation is being resumed (block 352: Yes) when the timer value $t_{TIMER}$ and/or the flattop resumption value $t_{FLATTOP\_RES}$ are set to a value between zero and the maximum flattop value $t_{FLATTOP}$.

In embodiments in which the timer value $t_{TIMER}$ is incremented while an erase pulse remains at flattop, the routine 350 can determine that the erase operation is not being resumed (block 352: No) when the timer value $t_{TIMER}$ and/or the flattop resumption value $t_{FLATTOP\_RES}$ are set to zero (e.g., indicating that erase pulses of the erase operation have not spent any time at flattop), are set to a NULL value (e.g., indicating that the timer value $t_{TIMER}$ and/or the flattop resumption value $t_{FLATTOP\_RES}$ have not yet been set or initiated), or are set to the maximum flattop value $t_{FLATTOP}$ (e.g., indicating that the timer value $t_{TIMER}$ and/or the flattop resumption value $t_{FLATTOP\_RES}$ have been exhausted). On the other hand, the routine 350 can determine that the erase operation is being resumed (block 352: Yes) when the timer value $t_{TIMER}$ and/or the flattop resumption value $t_{FLATTOP\_RES}$ are set to a value between zero and the maximum flattop value $t_{FLATTOP}$.

In these and other embodiments, the routine 350 determines whether the erase operation is being resumed by analyzing one or more other values stored on the memory device. For example, the memory device can store a resumption bit in the memory device. Continuing with this example, the routine 350 can determine that the erase operation is not being resumed (block 352: No) when the resumption bit is in a first bit state (e.g., a low or '0' bit state), and can determine that an erase pulse is being resumed (block 352: Yes) when the resumption bit is in a second bit state (e.g., a high or '1' bit state). The routine 350 can toggle the resumption bit from the first bit state to the second bit state after receiving an erase suspend command (block 356: Yes) and/or can toggle the resumption bit from the second bit state to the first bit state before, during, or after determining that the timer value $t_{TIMER}$ is exhausted (block 358: Yes).

If the routine 350 determines that the erase operation is being resumed (block 352: Yes), then the routine 350 proceeds to block 354 to set the timer value $t_{TIMER}$ equal to the flattop resumption value $t_{FLATTOP\_RES}$. Otherwise (block 352: No), the routine 350 proceeds to block 353 to initiate or set the timer value $t_{TIMER}$ equal to (a) the maximum flattop value $t_{FLATTOP}$ in embodiments in which the timer value $t_{TIMER}$ is decremented while an erase pulse remains at flattop, or (b) zero in embodiments in which the timer value $t_{TIMER}$ is incremented while an erase pulse remains at flattop. The routine 350 then proceeds to block 355.

At block 355, the routine 350 continues by running the timer. In some embodiments, running the timer includes decrementing the timer value $t_{TIMER}$ (a) starting from the maximum flattop value $t_{FLATTOP}$ when the routine 350 proceeds to block 355 from block 353, or (b) starting from the flattop resumption value $t_{FLATTOP\_RES}$ when the routine 350 proceeds to block 355 from block 354. The routine 350 can decrement the timer for as long as the erase pulse remains at flattop and/or the timer value $t_{TIMER}$ is greater than zero. In other embodiments, running the timer includes incrementing the timer value $t_{TIMER}$ (a) starting from zero when the routine 350 proceeds to block 355 from block 353, or (b) starting from the flattop resumption value $t_{FLATTOP\_RES}$ when the routine 350 proceeds to block 355 from block 354. The routine 350 can increment the timer for as long as the erase pulse remains at flattop and/or the timer value $t_{TIMER}$ is less than the maximum flattop value $t_{FLATTOP}$.

At block 356, the routine 350 continues by determining whether an erase suspend command has been received. As discussed above, a memory device can suspend an erase operation to prioritize executing read, write, or other commands. Thus, the routine 350 can receive an erase suspend command to execute one of the prioritized commands. In some embodiments, the routine 350 can determine that an erase suspend command has been received (block 356: Yes) when the memory device receives or issues an erase suspend command. Additionally, or alternatively, the routine 350 can determine that an erase suspend command has been received (block 356: Yes) when the memory device receives a command to execute a read, write, or other prioritized command.

If the routine 350 determines that an erase suspend command has been received (block 356: Yes), the routine 350 stops the timer, proceeds to block 357 to set the flattop resumption value $t_{FLATTOP\_RES}$ equal to the current timer value $t_{TIMER}$, and proceeds to block 359 to discharge the erase pulse. On the other hand, if the routine 350 determines that an erase suspend command has not been received (block 356: No), the routine 350 proceeds to block 358 without stopping the timer. In some embodiments, when the routine 350 detects an erase suspend command (block 356: Yes), the routine 350 can immediately proceed to blocks 357 and 359 rather than waiting for a next checkpoint as is done in many other memory devices or systems. As such, the routine 350 can immediately suspend the erase operation and discharge the erase pulse (block 359), thereby reducing (in comparison to other memory devices) an amount of time elapsed between when the routine 350 detects an erase suspend command and when the routine 350 returns the memory device to a ready state at which the memory device can execute a prioritized operation. In other words, the present technology is expected to decrease (a) an erase suspend operation time $t_{ESPD}$ in comparison to other memory devices and/or (b) an erase resume to erase suspend delay $t_{RSESPD}$ in comparison to other memory devices.

In some embodiments, when the routine 350 detects an erase suspend command (block 356: Yes), the routine 350 can compare the current timer value $t_{TIMER}$ to a minimum threshold value. If the routine 350 determines that the current timer value $t_{TIMER}$ is less than or equal to the minimum threshold value, the routine 350 can allow the timer to continue to run until it is exhausted (block 358: Yes). At that time, the routine 350 can proceed to block 359 to discharge the erase pulse. This is expected to allow an erase pulse to complete and/or to allow the memory device to perform an erase verification procedure before executing a prioritized operation whenever a relatively small amount of time remains for the erase pulse to stay at flattop before the timer value $t_{TIMER}$ reaches the maximum flattop value $t_{FLATTOP}$. On the other hand, if the routine 350 determines that the current timer value $t_{TIMER}$ is greater than the minimum threshold value, the routine 350 can proceed (a) to block 357 to set the flattop resumption value $t_{FLATTOP\_RES}$ equal to the current timer value $t_{TIMER}$ and (b) to block 359 to discharge the erase pulse.

At block 358, the routine 350 continues by determining whether the timer value $t_{TIMER}$ has been exhausted. The timer value $t_{TIMER}$ is exhausted when the cumulative amount of time that all erase pulses of an erase operation have spent at flattop reaches the maximum flattop value $t_{FLATTOP}$. In embodiments in which the timer value $t_{TIMER}$ is decremented while an erase pulse is at flattop, the routine 350 can determine that the timer value $t_{TIMER}$ is exhausted (block 358: Yes) when the timer value $t_{TIMER}$ reaches zero. Thus, the routine 350 can determine whether the timer value $t_{TIMER}$ has been exhausted by comparing the timer value $t_{TIMER}$ to zero. In embodiments in which the timer value $t_{TIMER}$ is incremented while an erase pulse is at flattop, the routine 350 can determine that the timer value $t_{TIMER}$ is exhausted (block 358: Yes) when the timer value $t_{TIMER}$ reaches the maximum flattop value $t_{FLATTOP}$. Thus, the routine 350 can determine whether the timer value $t_{TIMER}$ has been exhausted by comparing the timer value $t_{TIMER}$ to the maximum flattop value $t_{FLATTOP}$.

If the routine 350 determines that the timer value $t_{TIMER}$ has not been exhausted (block 358: No), the routine 350 returns to block 356. On the other hand, if the routine 350 determines that the timer value $t_{TIMER}$ has been exhausted (block 358: Yes), the routine 350 proceeds to block 359.

At block 359, the routine 350 continues by discharging the erase pulse from flattop and returning the memory device to a state at which the memory device can execute another command, such as a prioritized command, another erase command, or another command. In some embodiments, when the routine 350 proceeds to block 359 from block 358, the routine 350 can (a) reset the timer value $t_{TIMER}$ and/or the flattop resumption value $t_{FLATTOP\_RES}$ to zero, to a NULL value, or to the maximum flattop value $t_{FLATTOP}$, and/or (b) reset the resumption bit (e.g., to the first bit state). In these and other embodiments, when the routine 350 proceeds to block 359 from block 357, the routine 350 can (a) stop the timer and/or (b) toggle the resumption bit (e.g., from the first bit state to the second bit state).

At block 360, the routine 350 continues by performing an erase verification procedure. At block 361, the routine 350 determines whether the erase verification procedure passed. If the routine 350 determines that the erase verification procedure passed (block 361: Yes), the routine 350 proceeds to block 363 at which the erase operation is completed and the routine 350 ends. On the other hand, if the routine 350 determines that the erase verification procedure did not pass (block 361: No), the routine 350 proceeds to block 362 to increment the erase voltage $V_{ERA}$ by a (e.g., predetermined) amount $V_{ERA\_STEP}$ and then returns to block 351.

Although the steps of the routine 350 are discussed and illustrated in a particular order, the routine 350 of FIG. 3 is not so limited. In other embodiments, the steps of the routine 350 can be performed in a different order. In these and other embodiments, any of the steps of the routine 350 can be performed before, during, and/or after any of the other steps of the routine 350. For example, block 359 can be performed before or while executing block 357. As another example, the block 358 can be performed before or while executing block 356. Furthermore, a person skilled in the art will readily recognize that the routine 350 can be altered and still remain within these and other embodiments of the present technology. For example, one or more steps of the routine 350 can be omitted and/or repeated in some embodiments.

Figure 4A:
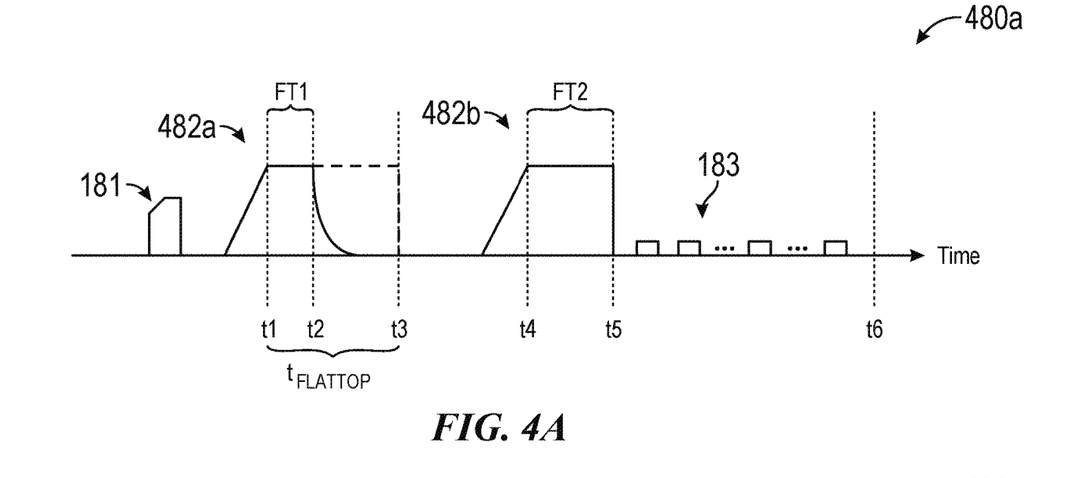
FIGS. 4A and 4B are line plots of signal pulses that can be issued in memory systems of the present technology during erase operations that are (a) suspended to execute other operations and (b) later resumed, in accordance with various embodiments of the present technology.
Figure 4B:
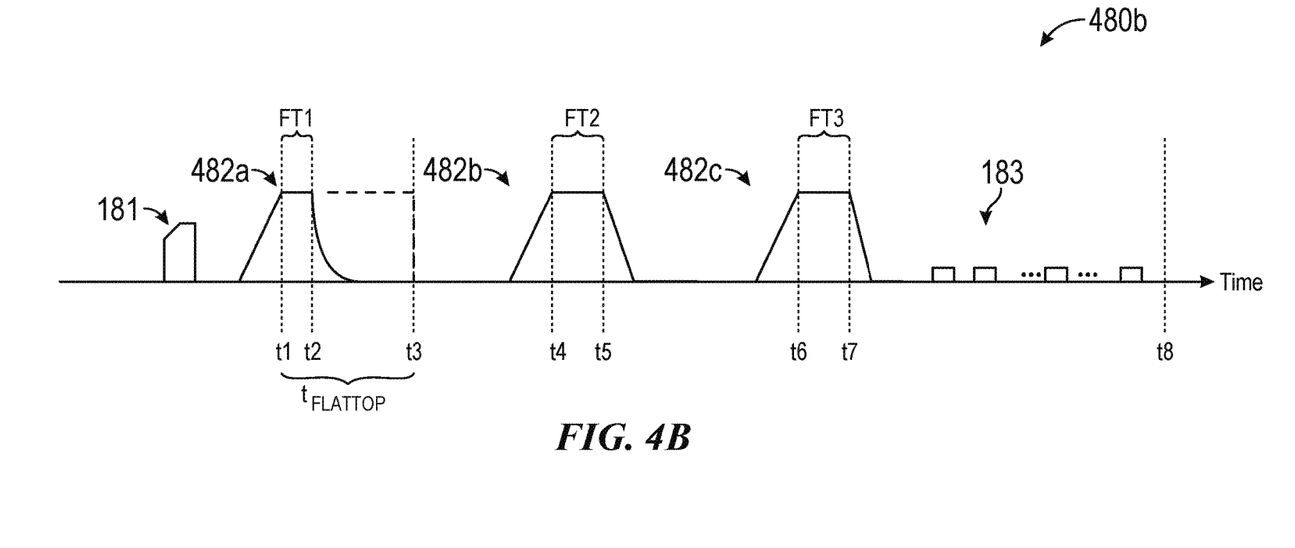

For the sake of clarity and explanation of the routine 350 of FIG. 3, consider FIGS. 4A and 4B that illustrate line plots 480a and 480b, respectively, of signal pulses that can be issued during example erase operations (a) that are suspended to execute one or more other prioritized operations and (b) that are later resumed, in accordance with various embodiments of the present technology. Referring first to FIG. 4A, a first erase pulse 482a is ramped after a PPGM pulse 181. The first erase pulse 482a reaches the flattop at time t1 at which point the routine 350 detects that the erase pulse 482a is at flattop (block 351). Because the first erase pulse 482a is a first erase pulse of the erase operation, the routine 350 determines that the corresponding erase operation is not being resumed (block 352: No), initiates the timer value $t_{TIMER}$ (e.g., to the maximum flattop value $t_{FLATTOP}$ in embodiments in which the timer is decremented while an erase pulse is at flattop, or to zero in embodiments in which the time is incremented while an erase pulse is at flattop) at block 353, and runs the timer at block 355.

At time t2 of FIG. 4A, the routine 350 detects that the memory device has received an erase suspend command (block 356: Yes), stops running the timer, sets the flattop resumption value $t_{FLATTOP\_RES}$ equal to the current timer value $t_{TIMER}$ (block 357), and discharges the erase pulse (block 359) to return the memory device to a ready state at which point the memory device can execute a prioritized operation (e.g., a read, write, or other operation). At some point thereafter, the memory device resumes the erase operation by ramping a second erase pulse 482b. For example, the memory device can resume the erase operation by ramping the second erase pulse without first performing an erase verification procedure. As such, the present technology is expected to obviate the practice of first performing an erase verification procedure upon resumption of an erase operation and before issuing another erase pulse, thereby reducing erase resume to erase suspend delay $t_{RSESPD}$ in comparison to other memory devices.

At time t4 of FIG. 4A, the routine 350 detects that the second erase pulse 482b is at flattop (block 351), determines that the corresponding erase operation is being resumed (block 352: Yes), sets the timer value $t_{TIMER}$ equal to the flattop resumption value $t_{FLATTOP\_RES}$ (block 354), and runs the timer (block 355). In some embodiments, after the memory device or system resumes an erase operation (e.g., at time t4 of FIG. 4A), the routine 350 can prevent another suspension of the erase operation for a minimum amount of time. The minimum amount of time can ensure at least a minimal forward progress of the erase operation before the erase operation can again be suspended.

In FIG. 4A, the routine 350 detects no other erase suspend commands (block 356: No) before the routine 350 determines that the timer value $t_{TIMER}$ has been exhausted (block 358: Yes) by comparing the timer value $t_{TIMER}$ to zero (in embodiments in which the timer value $t_{TIMER}$ is decremented) or to the maximum flattop value $t_{FLATTOP}$ (in embodiments in which the timer value $t_{TIMER}$ is incremented). For example, the routine 350 can cycle back and forth between block 356 and block 358 until either the routine 350 detects an erase suspend command (block 356: Yes) or until the timer value $t_{TIMER}$ is exhausted (block 358: Yes). After the routine 350 determines that the timer value $t_{TIMER}$ has been exhausted (block 358: Yes), the routine 350 discharges the second erase pulse 482b (block 359) at time t5 of FIG. 4A, and the memory device proceeds to performing an erase verification procedure (block 360) by issuing a series of EV pulses 183. At time t6 of FIG. 4A, the erase verification procedure is expected to pass (block 361: Yes), at which point the memory device completes the erase operation (block 363).

Although the erase operation of FIG. 4A is suspended only once while the erase pulse is at flattop, the routine 350 can be similarly applied in situations in which an erase operation is suspended multiple times while an erase pulse is at flattop. For example, referring now to FIG. 4B, the routine 350 detects two erase suspend operations: a first erase suspend command at time t2 while a first erase pulse 482a is at flattop and a second erase suspend command at time t5 while a second erase pulse 482b is at flattop. The two erase suspend commands result in three erase pulses 482a-482c having different flattop widths FT1-FT3, respectively, before the memory device proceeds to (a) performing an erase verification procedure by issuing a series of EV pulses 183 and (b) completing the erase operation at time t8.

As shown in FIG. 4A, an amount of time FT1 that the first erase pulse 482a remains at flattop (shown as the difference between time t2 and time t1) plus an amount of time FT2 that the second erase pulse 482b remains at flattop (shown as the difference between time t5 and time t4) is equivalent to the maximum flattop value $t_{FLATTOP}$ (shown as the difference between the time t3 and the time t1). Similarly, as shown in FIG. 4B, an amount of time FT1 that the first erase pulse 482a remains at flattop (shown as the difference between time t2 and time t1) plus an amount of time FT2 that the second erase pulse 482b remains at flattop (shown as the difference between time t5 and time t4) plus an amount of time FT3 that the third erase pulse 482c remains at flattop (shown as the difference between time t7 and time t6) is also equivalent to the maximum flattop value $t_{FLATTOP}$ (shown as the difference between the time t3 and the time t1). Thus, at no point during the erase operation illustrated in FIG. 4A or during the erase operation illustrated in FIG. 4B are memory cells of the memory device erased while the erase pulses are at flattop for a total amount of time that is greater than the amount of time the memory cells would have been erased had the erase operation been performed without the memory device receiving an erase suspend command. In other words, the routine 350 of FIG. 3 represents a flexible erase suspend-resume routine that can dynamically split a full erase pulse flattop (represented by the maximum flattop value $t_{FLATTOP}$) into multiple segmentations corresponding to separate erase pulses upon detection of one or more erase suspend commands while an erase pulse of an erase operation is at flattop. Therefore, the present technology is expected to avoid the degradation of memory cell reliability caused by over erasure that is possible in erase suspend-resume operations of other memory devices. Additionally, although flexible erase suspend-resume routines of the present technology can split a full erase pulse flattop into multiple erase pulses having smaller flattop widths, the multiple erase pulses are expected to achieve (a) the same or similar erase depth (e.g., number of memory cells erased to a negative threshold voltage $V_t$ level) for any given temperature, erase voltage $V_{ERA}$, and/or rate at which the erase pulse(s) are ramped to flattop as (b) the erase depth achieved via a single erase pulse that remains at flattop for an amount of time equivalent to the maximum flattop value $t_{FLATTOP}$.

Figure 5:
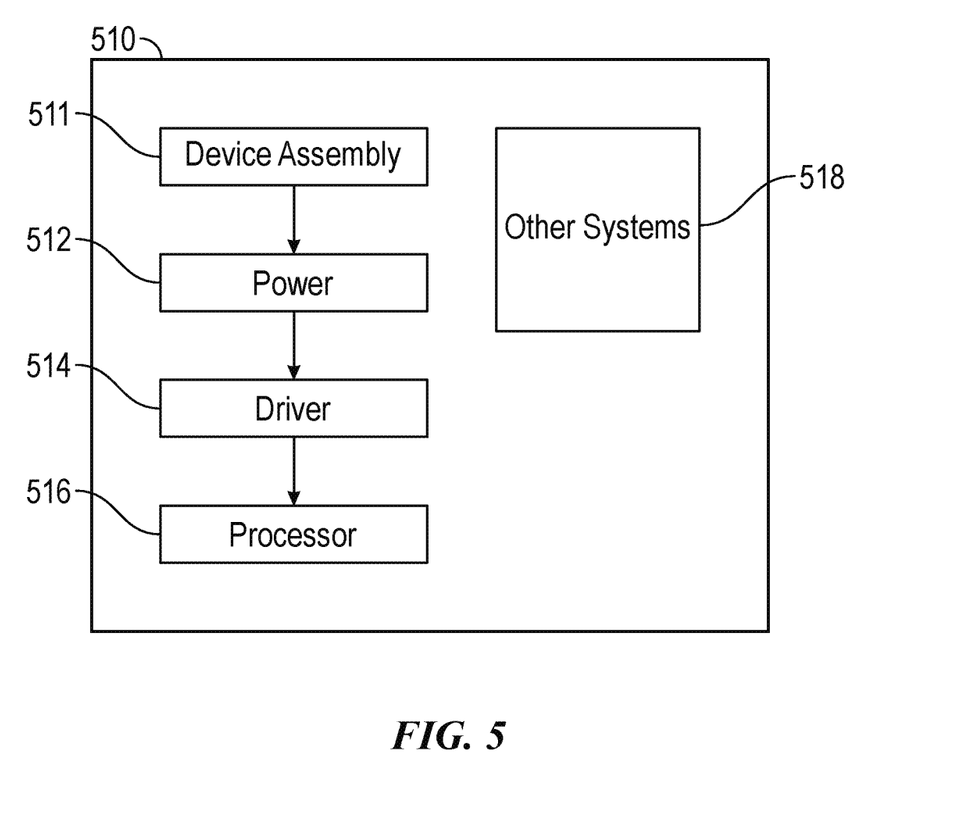
FIG. 5 is a schematic view of a system that includes a semiconductor device assembly configured in accordance with various embodiments of the present technology.

FIG. 5 is a schematic view of a system that includes a memory device in accordance with embodiments of the present technology. Any one of the foregoing memory devices described above can be incorporated into any of a myriad of larger and/or more complex systems, a representative example of which is system 510 shown schematically in FIG. 5. The system 510 can include a semiconductor device assembly 511, a power source 512, a driver 514, a processor 516, and/or other subsystems and components 518. The semiconductor device assembly 511 can include features generally similar to those of the memory devices described above with reference to FIGS. 1-4B, and can, therefore, include flexible erase suspend-resume operations. The resulting system 510 can perform any of a wide variety of functions, such as memory storage, data processing, and/or other suitable functions. Accordingly, representative systems 510 can include, without limitation, hand-held devices (e.g., mobile phones, tablets, digital readers, and digital audio players), computers, vehicles, appliances, and other products. Components of the system 510 may be housed in a single unit or distributed over multiple, interconnected units (e.g., through a communications network).

The components of the system 510 can also include remote devices and any of a wide variety of computer readable media.

C. CONCLUSION

As used herein, the terms "memory system" and "memory device" refer to systems and devices configured to temporarily and/or permanently store information related to various electronic devices. Accordingly, the term "memory device" can refer to a single memory die and/or to a memory package containing one or more memory dies. Similarly, the term "memory system" can refer to a system including one or more memory dies (e.g., a memory package) and/or to a system (e.g., an SSD) including one or more memory packages.

Where the context permits, singular or plural terms can also include the plural or singular term, respectively. In addition, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded. Moreover, as used herein, the phrases "based on," "depends on," "as a result of," and "in response to" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on" or the phrase "based at least partially on."

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. From the foregoing, it will also be appreciated that various modifications can be made without deviating from the technology. For example, various components of the technology can be further divided into subcomponents, or various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A memory device, comprising:
   a memory array, and
   an internal processing circuit configured to:
      receive an erase suspend command while a first erase pulse of an erase operation of memory cells of the memory array is at a flattop voltage;
      in response to the erase suspend command, immediately suspend the erase operation, wherein a first total amount of time represents a duration that the first erase pulse remained at the flattop voltage before suspending the erase operation; and
      resume the erase operation, wherein resuming the erase operation includes ramping a second erase pulse of the erase operation to the flattop voltage,
   wherein the first erase pulse and the second erase pulse represent segments of a full erase pulse of erase operations of the memory device that, absent intervening erase suspend commands, remains at the flattop voltage for a total amount of time, and
   wherein a sum of (a) the first total amount of time and (b) a second total amount of time the second erase pulse remains at the flattop voltage, is less than or equal to the total amount of time the full erase pulse remains at the flattop voltage.

2. The memory device of claim 1, wherein immediately suspending the erase operation includes immediately discharging the first erase pulse in response to the erase suspend command.

3. The memory device of claim 1, wherein resuming the erase operation includes ramping the second erase pulse to the flattop voltage before executing an erase verification procedure of the erase operation.

4. The memory device of claim 1, wherein the internal processing circuit is further configured to detect when the first erase pulse reaches the flattop voltage.

5. The memory device of claim 4, wherein, in response to detecting that the first erase pulse has reached the flattop voltage, the internal processing circuit is further configured to run a timer from a first value while the first erase pulse remains at the flattop voltage.

6. The memory device of claim 5, wherein, in response to detecting that the first erase pulse has reached the flattop voltage, the internal processing circuit is further configured to initiate the timer to the first value.

7. The memory device of claim 5, wherein suspending the erase operation further includes (a) discharging the first erase pulse and (b) storing a current value of the timer when the first erase pulse is discharged.

8. The memory device of claim 1, wherein the internal processing circuit is further configured to:
   detect when the second erase pulse reaches the flattop voltage, and
   in response to detecting that the second erase pulse has reached the flattop voltage and while the second erase pulse remains at the flattop voltage, run a timer from a value stored in the memory device.

9. The memory device of claim 8, wherein suspending the erase operation includes discharging the first erase pulse, and wherein the value stored in the memory device is equivalent to a first value of the timer when the first erase pulse is discharged.

10. The memory device of claim 8, wherein, in response to detecting that the second erase pulse has reached the flattop voltage, the internal processing circuit is further configured to set the timer to the value stored in the memory device.

11. The memory device of claim 8, wherein the internal processing circuit is further configured to discharge the second erase pulse after the timer runs from the value stored in the memory device to exhaustion, wherein the second total amount of time represents a duration that the second erase pulse remained at the flattop voltage before discharging the second erase pulse.

12. The memory device of claim 8, wherein:
the erase suspend command is a first erase suspend command; and
in response to receiving a second erase suspend command, the internal processing circuit is further configured to:
compare a current value of the timer to a minimum threshold value; and
in response to determining that the current value of the timer is less than the minimum threshold value, prevent suspension of the erase operation until after the timer is exhausted, after an erase verification procedure is performed, or after completion of the erase operation.

13. The memory device of claim 8, wherein:
the erase suspend command is a first erase suspend command; and
the internal processing device is further configured to:
receive a second erase suspend command while the second erase pulse is at the flattop voltage,
in response to receiving the second erase suspend operation, suspend the erase operation, wherein suspending the erase operation includes storing a current value of the timer and discharging the second erase pulse, and wherein the second total amount of time represents a duration that the second erase pulse remained at the flattop voltage before suspending the erase operation in response to receiving the second erase suspend operation,
resume the erase operation, wherein resuming the erase operation includes ramping a third erase pulse to the flattop voltage,
while the third erase pulse remains at the flattop voltage, running the timer from the current value to exhaustion, and
in response to determining that the timer is exhausted, discharging the third erase pulse, wherein a third total amount of time represents a duration that the third erase pulse remained at the flattop voltage before discharging the third erase pulse, and wherein the sum of the first, second, and third total amounts of time is less than or equal to the total amount of time the full erase pulse remains at the flattop voltage.

14. The memory device of claim 1, wherein:
the erase suspend command is a first erase suspend command; and
the internal processing device is further configured to delay suspending the erase operation in response to receiving a second erase suspend command until a preset minimum amount of time has elapsed after resuming the erase operation.

15. The memory device of claim 1, wherein:
the erase suspend command is a first erase suspend command; and
the internal processing circuit is further configured to:
receive a second erase suspend command before ramping the first erase pulse to the flattop voltage, and delay suspending the erase operation until after a pre-program pulse of the erase operation and before ramping the first erase pulse to the flattop voltage, or
receive a third erase suspend command while executing an erase verification procedure of the erase operation, and delay suspending the erase operation until after the erase verification procedure is completed.

16. A non-transitory, computer-readable medium having instructions stored thereon that, when executed by at least one processor of a memory device, cause the memory device to perform a method, the method comprising:
receiving an erase suspend command while a first erase pulse of an erase operation of the memory device is at a flattop voltage;
in response to the erase suspend command, immediately suspending the erase operation, wherein a first total amount of time represents a duration that the first erase pulse remained at the flattop voltage before suspending the erase operation; and
resuming the erase operation, wherein resuming the erase operation includes ramping a second erase pulse of the erase operation to the flattop voltage,
wherein the first erase pulse and the second erase pulse represent segments of a full erase pulse of erase operations of the memory device that, absent intervening erase suspend commands, remains at the flattop voltage for a total amount of time, and
wherein a sum of (a) the first total amount of time and (b) a second total amount of time the second erase pulse remains at the flattop voltage, is less than or equal to the total amount of time the full erase pulse remains at the flattop voltage.

17. The non-transitory, computer-readable medium of claim 16, wherein the method further comprises:
in response to detecting that the first erase pulse has reached the flattop voltage, initiating a timer to a first value; and
running the timer from the first value while the first erase pulse remains at the flattop voltage.

18. The non-transitory, computer-readable medium of claim 17, wherein suspending the erase operation further includes (a) discharging the first erase pulse and (b) storing a current value of the timer when the first erase pulse is discharged.

19. The non-transitory, computer-readable medium of claim 16, wherein:
suspending the erase operation includes discharging the first erase pulse; and
the method further comprises:
in response to detecting that the second erase pulse has reached the flattop voltage, set a timer to a value stored in the memory device, wherein the value stored in the memory device is equivalent to a first value of the timer when the first erase pulse is discharged; and
while the second erase pulse remains at the flattop voltage, run the timer from the value stored in the memory device.

20. A system, comprising:
a memory device having a memory controller and a memory array, wherein the memory device is configured to:
  in response to detecting that a first erase pulse of an erase operation has reached a flattop voltage, initiate a timer to a first value,
  run the timer from the first value while the first erase pulse remains at the flattop voltage,
  receive a prioritized command from a host device operably connected to the memory device, wherein the prioritized command is received while the first erase pulse is at the flattop voltage,
  in response to receiving the prioritized command, perform an erase suspend operation, wherein a first total duration represents a first amount of time that the first erase pulse remained at the flattop voltage before performing the erase suspend operation,
  execute the prioritized command, and
  resume the erase operation such that a second erase pulse of the erase operation is ramped to the flattop voltage;
wherein, absent intervening erase suspend operations, erase operations of the memory device include a single erase pulse that remains at the flattop voltage for a total duration; and wherein the first total duration plus a second total duration the second erase pulse remains at the flattop voltage is less than or equal to the total duration the single erase pulse remains at the flattop voltage.

21. The system of claim 20, wherein, to perform the erase suspend operation, the memory device is configured to (a) discharge the first erase pulse and (b) store a current value of the timer when the first erase pulse is discharged.

22. The system of claim 21, wherein:
the memory device is further configured to:
  in response to detecting that the second erase pulse has reached the flattop voltage, set the timer to the stored current value of the timer;
  while the second erase pulse remains at the flattop voltage, run the timer from the current value to exhaustion; and
  in response to determining that the timer is exhausted, discharge the second erase pulse, wherein the second total duration represents a second amount of time that the second erase pulse remained at the flattop voltage before discharging the second erase pulse.

* * * * *